US006821855B2

(12) United States Patent
Juengling et al.

(10) Patent No.: US 6,821,855 B2
(45) Date of Patent: Nov. 23, 2004

(54) REVERSE METAL PROCESS FOR CREATING A METAL SILICIDE TRANSISTOR GATE STRUCTURE

(75) Inventors: Werner Juengling, Boise, ID (US); Richard H. Lane, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/230,203

(22) Filed: Aug. 29, 2002

(65) Prior Publication Data

US 2004/0043573 A1 Mar. 4, 2004

(51) Int. Cl.⁷ ............................................. H01L 21/336
(52) U.S. Cl. ........................ 438/289; 438/290; 438/305
(58) Field of Search ................................ 438/289–291, 438/303, 305; 257/E21.165, E21.435

(56) References Cited

U.S. PATENT DOCUMENTS

| | | | | |
|---|---|---|---|---|
| 5,429,956 A | * | 7/1995 | Shell et al. ................. | 438/291 |
| 5,512,770 A | * | 4/1996 | Hong ......................... | 257/345 |
| 5,605,855 A | * | 2/1997 | Chang et al. ............... | 438/291 |
| 5,686,331 A | | 11/1997 | Song | |
| 5,712,501 A | * | 1/1998 | Davies et al. ............... | 257/335 |
| 5,731,239 A | * | 3/1998 | Wong et al. ................. | 438/296 |
| 5,770,507 A | | 6/1998 | Chen et al. | |
| 5,891,784 A | * | 4/1999 | Cheung et al. ............. | 438/303 |
| 5,981,346 A | | 11/1999 | Hopper | |
| 6,013,569 A | | 1/2000 | Lur et al. | |
| 6,043,545 A | | 3/2000 | Tseng et al. | |
| 6,251,778 B1 | | 6/2001 | Fang et al. | |
| 6,287,925 B1 | | 9/2001 | Yu | |
| 6,300,201 B1 | * | 10/2001 | Shao et al. ................. | 438/281 |
| 6,383,876 B1 | * | 5/2002 | Son et al. ................... | 438/289 |
| 6,423,634 B1 | * | 7/2002 | Wieczorek et al. ......... | 438/655 |
| 6,544,853 B1 | * | 4/2003 | Lin ............................. | 438/305 |
| 6,635,536 B2 | * | 10/2003 | Shin et al. .................. | 438/276 |

FOREIGN PATENT DOCUMENTS

EP           0327152 A1    8/1989

OTHER PUBLICATIONS

Wolf S. "Silicon Processing for the VLSI–ERA: Vol. 2–Process Integration", 1990, Lattice Pr., vol. 2, p. 199.*

* cited by examiner

*Primary Examiner*—George Fourson
(74) *Attorney, Agent, or Firm*—Dickstein Shapiro Morin & Oshinsky LLP

(57) ABSTRACT

The present invention teaches a method of forming a MOSFET transistor having a silicide gate which is not subject to problems produced by etching a metal containing layer when forming the gate stack structure. A gate stack is formed over a semiconductor substrate comprising a gate oxide layer, a conducting layer, and a first insulating layer. Sidewall spacers are formed adjacent to the sides of the gate stack structure and a third insulating layer is formed over the gate stack and substrate. The third insulating layer and first insulating layer are removed to expose the conducting layer and, at least one unetched metal-containing layer is formed over and in contact with the conducting layer. The gate stack structure then undergoes a siliciding process with different variations to finally form a silicide gate.

37 Claims, 12 Drawing Sheets

REVERSE METAL PROCESS FOR CREATING A METAL SILICIDE TRANSISTOR GATE STRUCTURE

BACKGROUND OF THE INVENTION

1. Field of the Invention

The present invention relates generally to the field of integrated circuit fabrication, and more specifically to a fabrication process for use in creating transistor structures in a semiconductor substrate.

2. Description of the Related Art

Currently, transistors, such as metal-oxide semiconductor field-effect transistors (MOSFET) are formed over a semiconductor substrate and are used in many integrated circuit devices. The MOSFET transistor utilizes a gate electrode to control an underlying surface channel joining a source and drain region. The substrate is doped oppositely to the source and drain regions. For example, the source and drain are of the same conductivity, e.g., N-type conductivity, whereas the channel has the conductivity of the semiconductor substrate, e.g., P-type conductivity. Typically, the gate electrode is separated from the semiconductor substrate by a thin insulating layer such as a gate oxide. The channel, source, and drain are located within the semiconductor substrate.

In a typical process forming the gate electrode of a MOSFET transistor, successive blanket depositions of various layers occur. First, an insulating layer for use as a gate oxide is formed on the surface of a semiconductor substrate. Second, a conductive layer such as a polysilicon is formed on top of the insulating layer. Third, a thin refractory metal layer is often deposited, such as tungsten, on top of the conductive layer which is used to form a silicide with the underlying polysilicon. An insulating layer may also be applied over the tungsten layer. This stack of layers is etched to define what ultimately becomes the gate stack for the transistor.

However, the presence of a refractory metal layer such as tungsten, can create problems during a gate stack etching process. Tungsten is a grainy and coarse metal. Accordingly, the etch front as it passes through the tungsten layer, becomes grainy and uneven resulting in a non-uniform etch which can cause undesired effects. For instance, the uneven etch front can result in undesired overetching into portions of the substrate surface. In addition, tungsten particles in the etch mixture can coat the sidewalls of the gate stack producing undesired shorts. The non-uniform etch front can also result in the polysilicon and oxide layers in the gate stack to be undesirably partially etched. If for example, the polysilicon layer is partially etched, it no longer properly functions as an effective self-aligned implant mask during source and drain implantation.

BRIEF SUMMARY OF THE INVENTION

The present invention addresses the noted problems and provides a method for forming MOSFET transistors, in which a refractory metal, such as tungsten, is not present during the gate stack etching process, but is subsequently added after gate stack etching occurs.

In the present invention, a transistor having a gate stack is produced by layering a gate oxide layer, a conducting layer, and a first insulating layer, over a semiconductor wafer; etching the respective layers to define a gate stack, implanting source and drain regions on opposite sides of the gate stack, providing an additional insulating layer over the implanted substrate and gate stack structure, forming an opening in the additional insulating layer over and down to the conducting layer, and then forming an unetched metal-containing layer, which is used to form a silicide layer over the conducting layer. In this way, a conductive layer which is used to form a silicide layer is not present during etching of the gate stack.

These and other advantages and features of the present invention will be more clearly understood from the following detailed description which is provided in connection with the accompanying drawings.

DETAILED DESCRIPTION OF THE INVENTION

The present invention will be understood from the following detailed discussion of the exemplary embodiments which is presented in connection with the accompanying drawings.

The present invention provides a method of forming a MOSFET transistor, and the resulting structure. In the following description, specific details such as layer thicknesses, process sequences, material compositions, are set forth to provide a complete understanding of the present invention. However, it will be obvious to one skilled in the art that the present invention can be employed with variations without departing from the spirit or scope of the invention.

The term "substrate" used in the following description may include any supporting structure including, but not limited to, a semiconductor substrate that has an exposed substrate surface. Semiconductor substrates should be understood to include silicon, silicon-on-insulator (SOI), silicon-on-sapphire (SOS), doped and undoped semiconductors, epitaxial layers of silicon supported by a base semiconductor foundation, and other semiconductor structures. When reference is made to a substrate or wafer in the following description, previous process steps may have been utilized to form regions or junctions in or over the base semiconductor or foundation. In addition, the semiconductor need not be silicon-based, but could be based on silicon-germanium, silicon-on-insulator, silicon-on-saphire, germanium, or gallium arsenide, among others.

Figure 1:
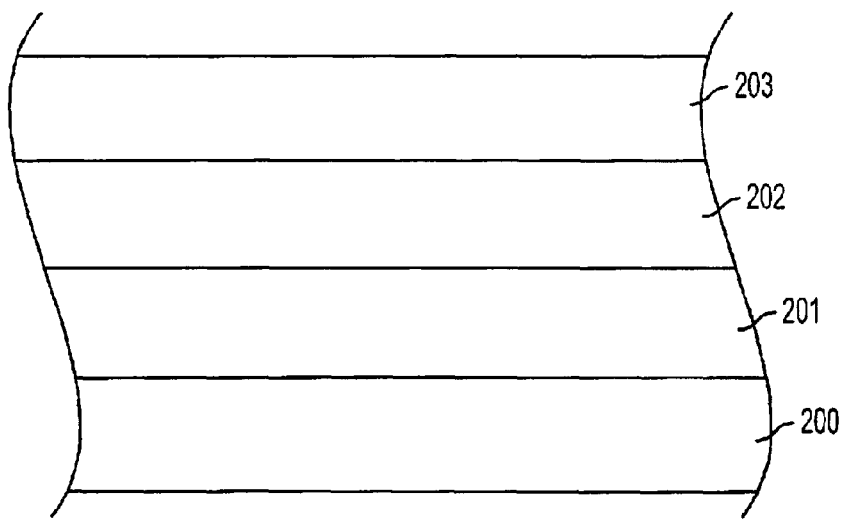
FIG. 1 is a cross-sectional view of a substrate containing oxide, polysilicon and insulating layers prior to gate stack formation.

Initially, as shown in FIG. 1, a gate oxide layer 201 is grown to a desired thickness on a semiconductor substrate 200, e.g. a silicon substrate. The substrate can be doped to a predetermined conductivity, or as described below, channel region implants may be formed in lieu of or in addition to the substrate doping. The gate oxide layer 201 can be for example, a $SiO_2$ (silicon dioxide) layer formed by thermal oxidation of the underlying silicon substrate region 200 or by any other conventional techniques well-known in the art. For purposes of a simplified description, silicon dioxide is employed as the gate oxide layer 201; however, other gate oxides well-known in the art can also be utilized.

Next, a polysilicon conducting layer 202 is formed by deposition on top of the gate oxide layer 201. Then, a first insulating layer 203, such as a nitride layer is deposited on top of the polysilicon conducting layer 202. Typically, the nitride layer 203 is formed on the polysilicon layer 202 by chemical vapor deposition (CVD). However, other techniques well-known in the art can also be utilized, such as sputtering, ALD processes, and PECVD to name a few. In addition, alternative materials besides silicon nitride, possessing the properties of a dielectric can also be utilized for layer 203.

Although the gate insulator material is described herein is referred to as silicon nitride, it is to be understood that the present invention also applies to gates that also contain other nitrides, such as oxynitride gate dielectrics, or silicon dioxide, or are solely comprised of nitrides, or that include other possible gate insulator materials, such as, tantalum pentoxide for example. The methods of the present invention can also be employed when high-K (high dielectric constant) gate materials are used.

Figure 2:
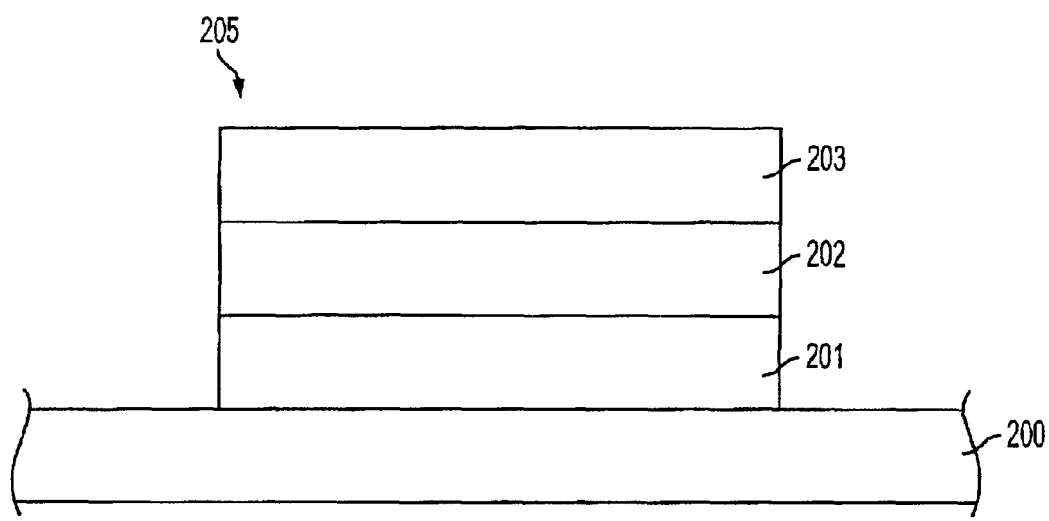
FIG. 2 is an illustration of a gate stack structure formed from the FIG. 1 structure.

In general, the nitride layer 203 acts as an etch stop for later chemical mechanical planarization processes (CMP) or any other processes well-known in the art. The gate oxide layer 201, polysilicon layer 202, and nitride layer 203 are used to form a gate stack. Referring now to FIG. 2, a gate stack 205 is formed by masking and etching layers 201, 202, and 203.

Figure 3A:
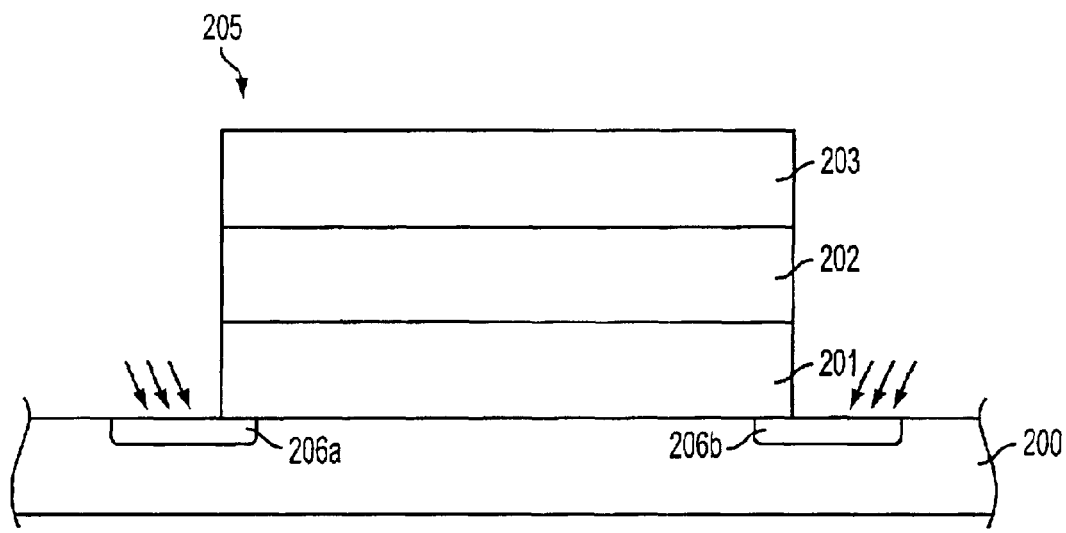
FIG. 3A is an illustration of the FIG. 2 structure after angled implants have been formed.
Figure 3B:
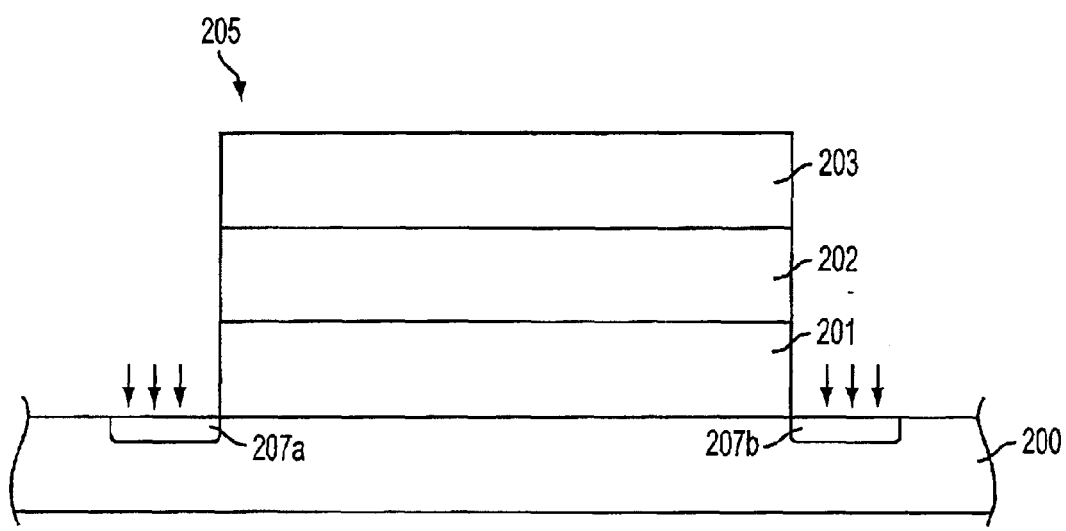
FIG. 3B is an illustration of the FIG. 2 structure after vertical implants have been formed.

Referring now to FIGS. 3A–3B, self-aligned source/drain implants can then be fabricated. Depending on the type of source/drain implants ultimately desired, the source/drain implants can be angled, as shown in FIG. 3A, to produce angled implant regions 206a, 206b, which at this stage, can be of the type that produces LDD implants in the final transistor structure. Thus, the doping can partially extend beneath the gate stack 205, as in FIG. 3A, or can be vertical 207a, 207b, as shown in FIG. 3B, in which case source/drain regions 207a, 207b do not significantly extend beneath the gate stack 205. For instance, source/drain regions 207a and 207b can be self-aligned to the gate stack structure 205. Other well-known LDD implant techniques can also be used in accordance with desired operating characteristics of the transistor under fabrication. Alternatively, implanting can also be omitted at this stage if LDD implants are not desired (not illustrated).

Figure 4A:
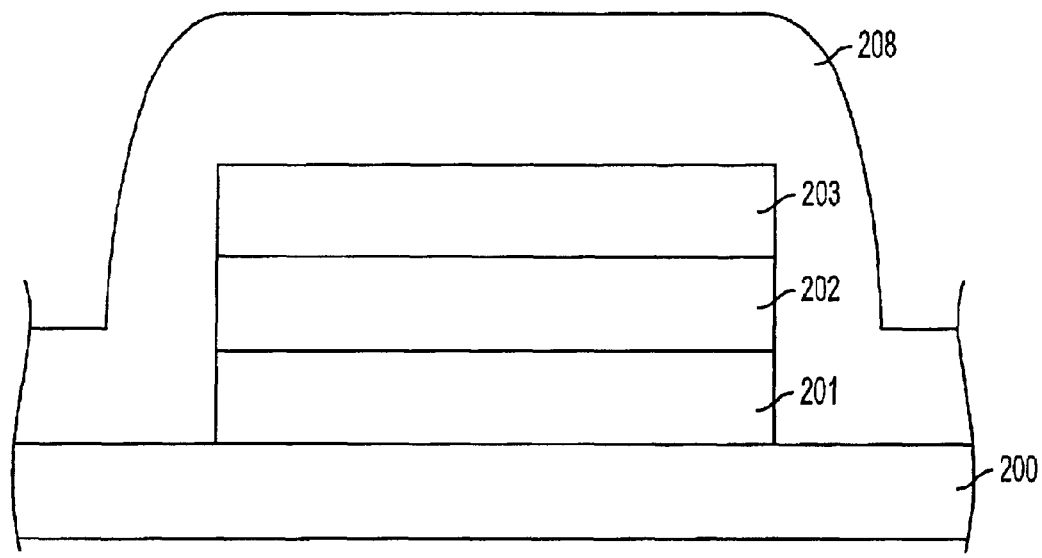
FIG. 4A is an illustration of the FIG. 3A structure after an oxide layer is deposited.

Next, as shown in FIG. 4A, an insulating layer, e.g., an oxide layer 208 is deposited, for example, by CVD techniques. However, other techniques well-known in the art can also be used to deposit oxide layer 208 (e.g., a spacer-forming layer). For instance, sputtering, ALD processes, or PECVD to name only a few. For instance, oxide layer 208 is deposited conformally over the surface of the silicon substrate 200 and gate stack structure 205. Although the present invention utilizes an oxide layer 208, alternative materials such as tetraethylorthosilicate (TEOS), a high density plasma (HDP) oxide, borosilicate glass (BPG), phosphosilicate glass (PSG), borophosphosilicate glass (BPSG), or other materials suitable for constructing sidewall spacers adjacent to the gate stack structure 205 can be used in lieu of or in combination with oxide layer 208. Oxide layer 208 (e.g., a spacer-forming layer) is then anisotropically etched, resulting in two oxide sidewall spacers 209a, 209b located adjacent to the sidewalls of the gate stack structure 205 as illustrated in FIG. 4B.

Figure 4B:
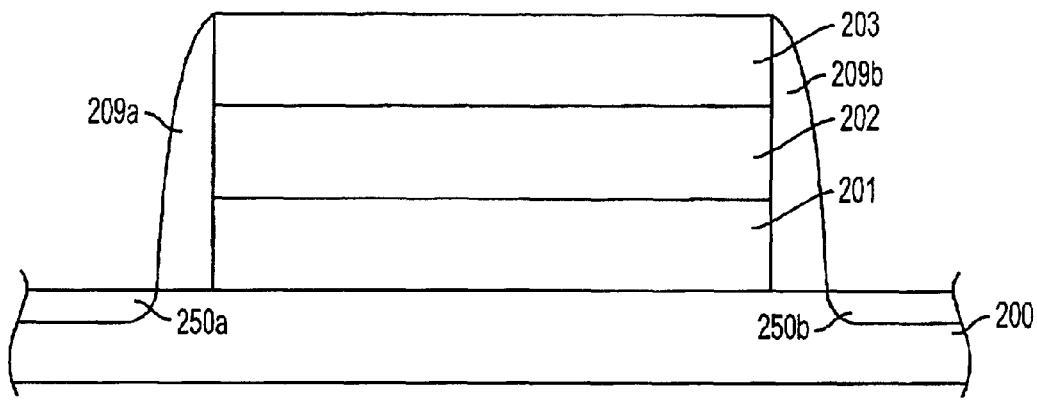
FIG. 4B is an illustration of the FIG. 4A structure after sidewall spacers are formed.
Figure 4C:
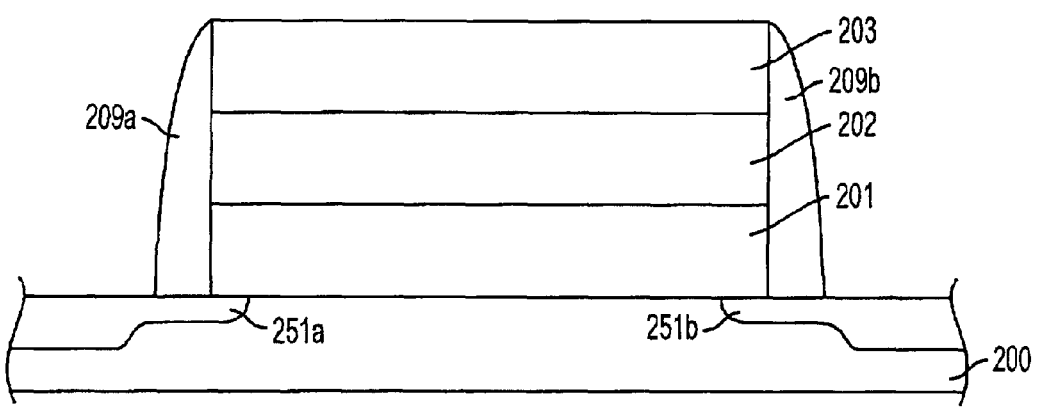
FIG. 4C is an illustration of the FIG. 4B structure after additional implants have been formed.

After the formation of sidewall spacers 209a, 209b, conventional source/drain implants 250a, 250b can be formed as illustrated in FIG. 4B if previous implants were not formed. As noted previously, if earlier LDD implants were formed, as in FIG. 3A, the source/drain regions 251a, 251b, are LDD regions as shown in FIG. 4C. For purposes of a simplified description, the illustrated structures show source/drain regions 250a, and 250b; however, it should be understood that the invention has equal applicability to transistors having LDD source/drain regions.

Figure 5A:
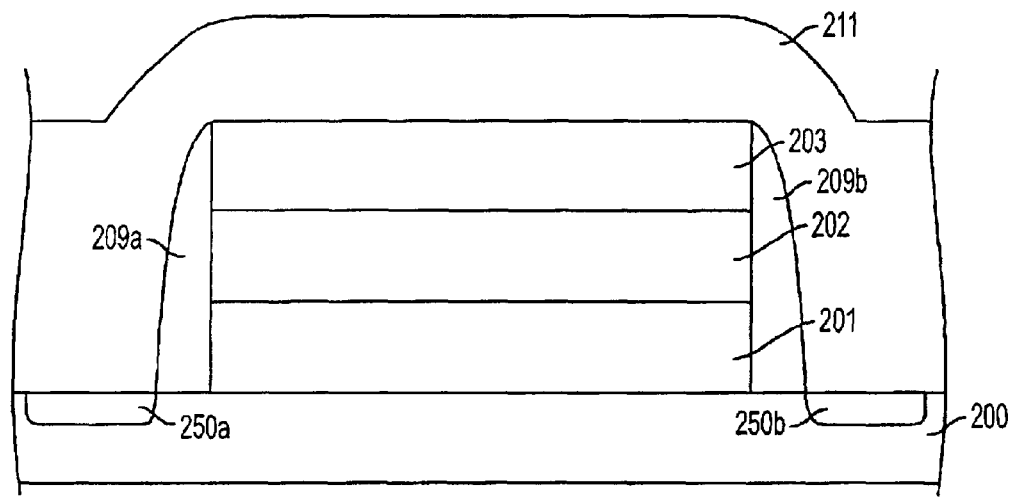
FIG. 5A is an illustration of the FIG. 4C structure after a first insulating layer is deposited.

A second insulating layer 211 is next blanket deposited over the substrate 200, and gate stack 205 having spacers 209a, 209b, as shown in FIG. 5A. The second insulating layer 211 can also be formed from the group consisting of HDP, BPG, PSG, BPSG, TEOS, and other alternative materials that are well-known in the art which may be used in lieu of or in combination to form the second insulating layer 211.

Figure 5B:
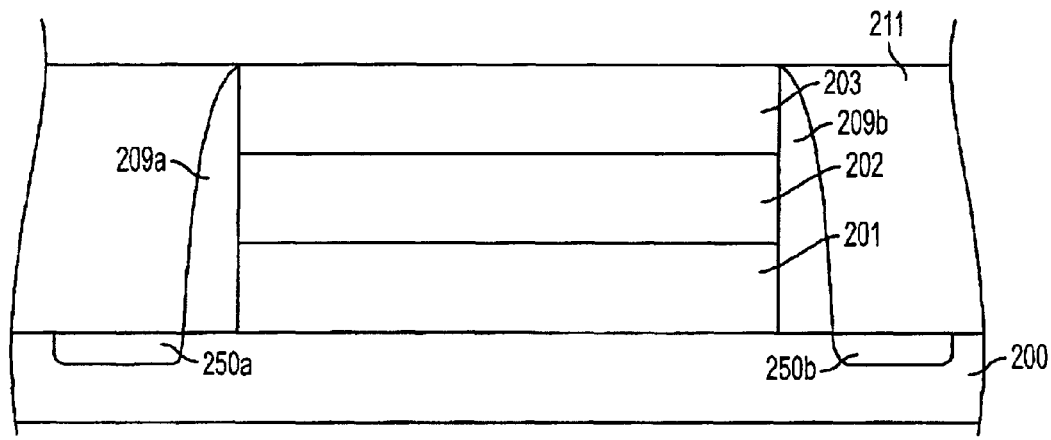
FIG. 5B is an illustration of the FIG. 5A structure after a CMP process.

Referring now to FIG. 5B, the second insulating layer 211 undergoes a chemical mechanical planarization process (CMP) down to the first insulating layer 203, e.g., nitride layer 203. As a result, the surface of the second insulating layer 211 becomes substantially planar with the surface of the exposed nitride layer 203. Again, other techniques that are well-known in the art can be used to form the surface of the second insulating layer 211 so that it becomes smooth and substantially planar with the surface of the exposed nitride layer 203.

Figure 5C:
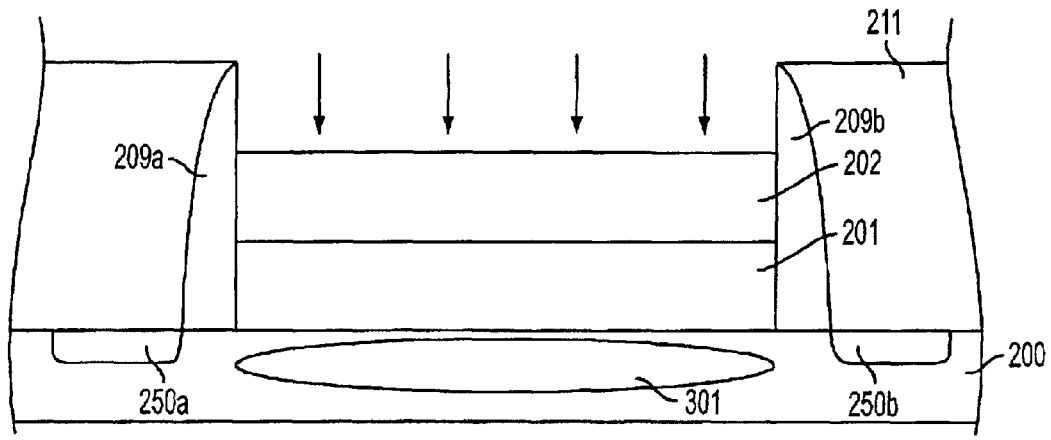
FIG. 5C is an illustration of the FIG. 5B structure after removal of the first insulating layer and a channel implant is formed.

Next, as shown in FIG. 5C, the nitride layer 203 (e.g., first insulating layer) is etched away using a wet nitride etch, e.g., $H_3PO_5$ (hot phosphoric), with a good selectivity to oxide. Other techniques that are well-known in the art can also be used to etch away the first insulating layer so that the conducting layer 202 is exposed. As a result, the nitride layer 203 is completely etched away exposing the surface of the conducting layer 202 as FIG. 5C illustrates. After this processing step, if channel implants are desired (and have not been performed previously), they can now be formed. Thus, optional channel implant region 301 can be formed by implanting dopant through the polysilicon layer 202 and the gate oxide layer 201 of the gate stack structure 205. The optional channel implant region 301 is formed beneath and is self-aligning to the gate stack 205. Spacers 209a and 209b at least in part, define optional channel implant region 301. It is to be appreciated, that additional channel implant regions can be fabricated if desired. Fabrication of additional channel implant regions utilizing the methods of the present invention are described below.

Figure 6A:
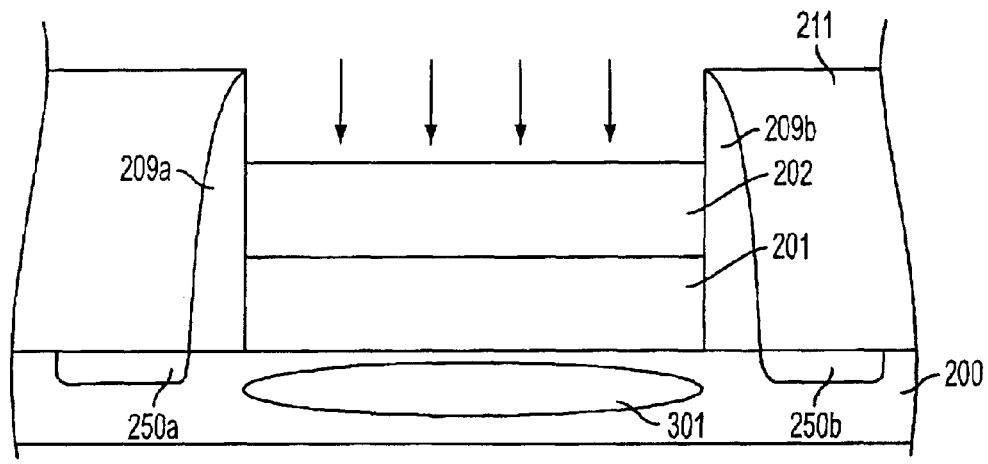
FIG. 6A is an illustration of the FIG. 5C structure prior to alternative channel implant processes.
Figure 6B:
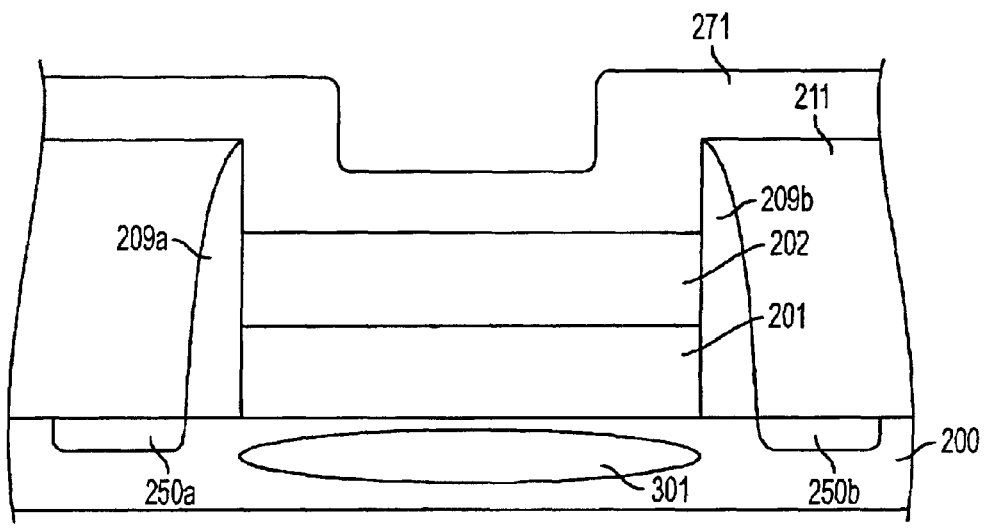
FIG. 6B is an illustration of the FIG. 6A structure after a second insulating layer is deposited.
Figure 6C:
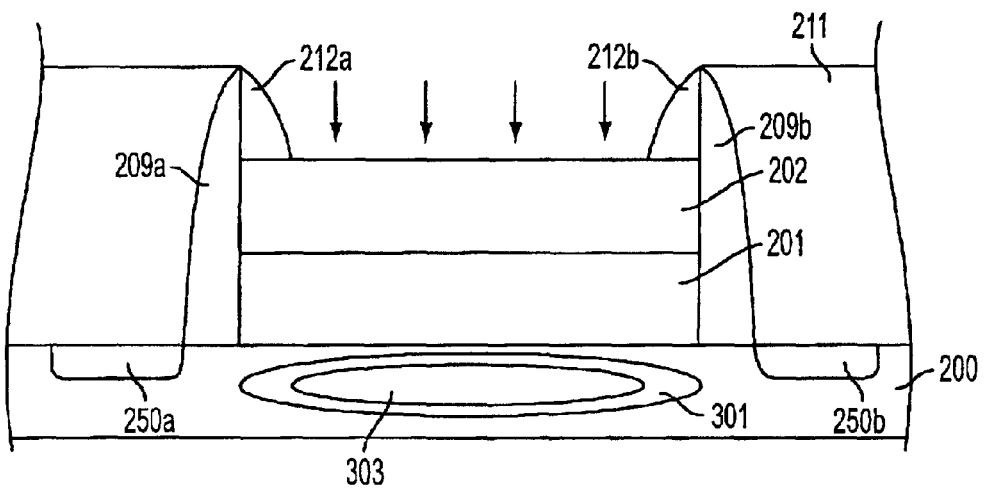
FIG. 6C is an illustration of the FIG. 6B structure after insulating spacers are formed and a second channel implant is performed.

Many channel implant variations are possible for channel implant regions in addition to optional channel implant region 301 illustrated in FIG. 5C. For example, another exemplary embodiment is illustrated in FIGS. 6A–6C. A first implant can be conducted, as illustrated in FIG. 6A, to form a first channel implant region 301 (similar to methods described in FIGS. 5A–5C). Then, a nitride layer 271 (e.g., a third insulating layer) can be blanket deposited as shown in FIG. 6B, and subsequently etched and planarized as shown in FIG. 6C, to produce nitride spacers 212a, 212b adjacent to the sides of the insulating layer 211 and covering at least a portion of the exposed conducting layer 202.

Although the present invention utilizes a nitride layer 271, other materials well-known in the art that are suitable for constructing spacers adjacent to the sides of the insulating layer 211 and covering at least a portion of the exposed conducting layer 202, can be used in lieu of or in combination with the nitride layer 271. A second optional channel implant can then be conducted to produce a channel implant region 303 smaller in size (e.g., smaller in width compared to the gate stack's 205 width and optional channel implant region 301's width) than channel implant region 301, as depicted in FIG. 6C.

Nitride spacers 212a and 212b, at least in part, define optional channel implant region 303. If nitride spacers 212a and 212b cover a greater portion of the conducting layer 202 (e.g., less surface area of the conducting layer 202 is exposed), the optional channel implant region 303 will be accordingly smaller in width. If nitride spacers 212a and 212b cover a smaller portion of the conducting layer 202 (e.g., more surface area of the conducting layer is exposed), the optional channel implant region 303 will be accordingly wider. Further, channel implant region 303 can possess a higher or smaller dopant concentration than channel implant region 301, depending upon the characteristics of the desired fabricated device. As a result, the construction of nitride spacers 212a and 212b can define the width of channel implant region 303 depending upon the desired device's operating characteristics.

Alternatively, in another embodiment of the present invention, the processing sequences forming optional channel implant region 301, shown in FIG. 6A, can be omitted in which case only channel implant region 303 is formed (not illustrated). The optional channel implant region 303 is narrower than the gate stack 205 due to the presence of the optional nitride spacers 212a, 212b, as shown in FIG. 6C, and is self-aligning to the gate stack structure 205. As described previously, channel implant region 303 is at least in part defined by nitride spacers 212a and 212b. As can be appreciated from the various embodiments, optional spacers 212a, 212b (comprised of nitride or other materials well-known in the art) can be fabricated to any desired size above the conducting layer 202 to create different sizes for channel implant region 303.

Figure 7A:
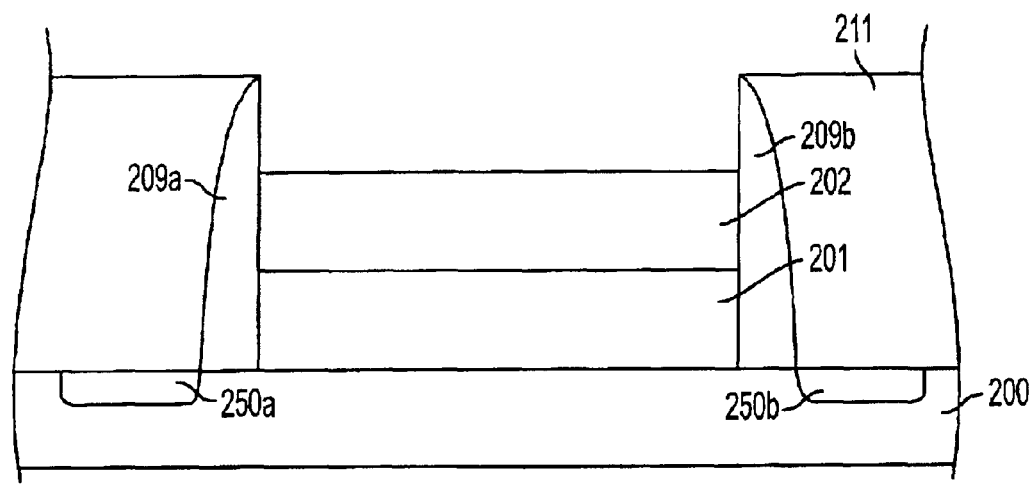
FIG. 7A is an illustration of the present invention in one embodiment prior to performing a first channel implant.
Figure 7B:
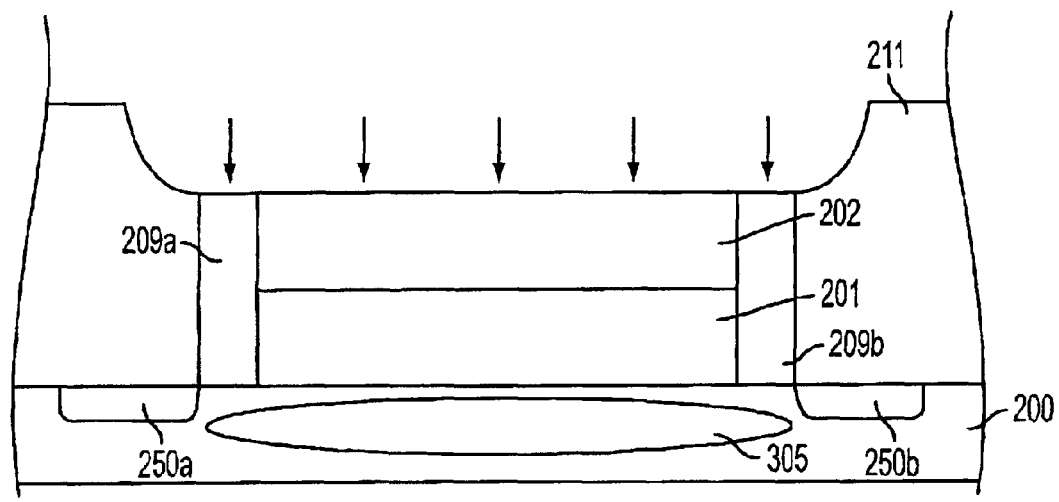
FIG. 7B is an illustration of the FIG. 8A structure after at least a portion of the insulating layer is removed and a first channel implant is performed.

Even more additional channel implant variations are depicted in FIGS. 7A–7D. Referring now to FIG. 7A, and as discussed previously in FIG. 5C, the nitride layer 203 (e.g., first insulating layer) is etched away using a wet nitride etch, e.g., $H_3PO_5$ (hot phosphoric), with a good selectivity to oxide. Then, portions of the second insulating layer 211 adjacent to the gate stack 205, are selectively etched to produce the structure in FIG. 7B, which possesses a wider channel implant region 305 than the width of the gate stack 205. As a result, a first channel implant region 305 can then be implanted as shown in FIG. 7B. As illustrated in FIG. 7B, channel implant region 305 is wider than the width of the gate stack structure 205. Thus, the degree of etching of the insulating layer 211 defines at least in part, the width of channel implant region 305. Additionally, if desired, formation of channel implant region 305 can be omitted.

Figure 7C:
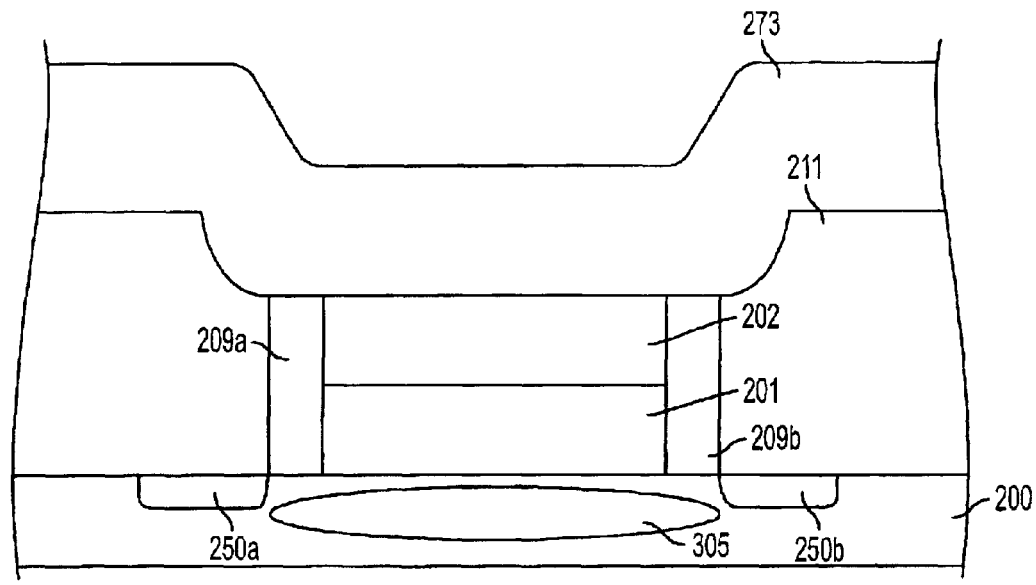
FIG. 7C is an illustration of the FIG. 8B structure after an additional insulating layer is deposited.
Figure 7D:
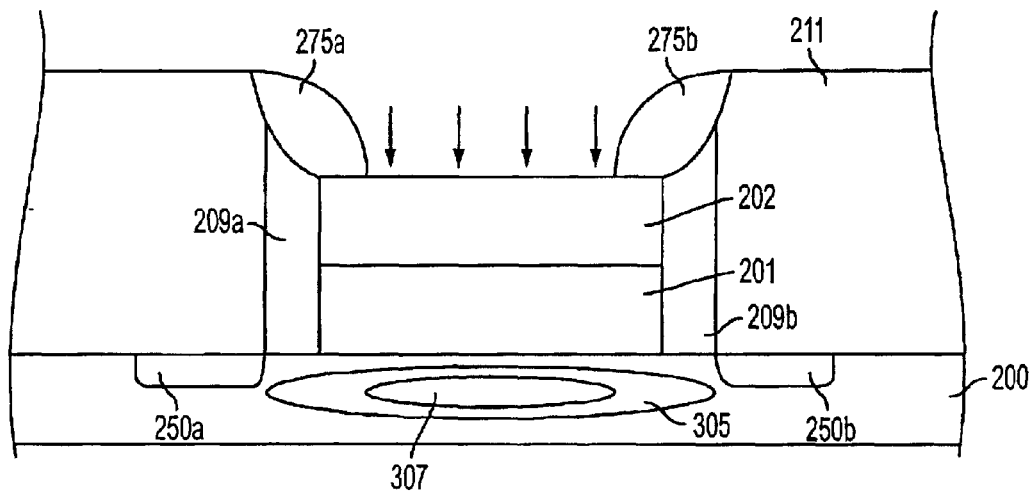
FIG. 7D is an illustration of the FIG. 8C structure after insulating spacers offset to the gate stack structure are formed and a second channel implant is formed.

Assuming channel implant region 305 is provided, following this, a nitride layer 273, e.g., an optional third insulating layer, can be blanket deposited as shown in FIG. 7C, and selectively etched to produce nitride spacers 275a, 275b as illustrated in FIG. 7D. Although the present invention utilizes a nitride layer 273 as the insulating layer, other materials well-known in the art that are suitable for constructing spacers adjacent to the sides and covering at least a part of the second insulating layer 211, and covering at least a part of the exposed conducting layer 202, can be used in lieu of or in combination with the nitride layer 273. A second optional channel implant region 307 can then be formed as shown in FIG. 7D that is self-aligning to the gate stack 205. The second channel implant region 307 is at least in part defined by spacers 275a and 275b.

As a result, the width of the optional channel implant region 307, illustrated in FIG. 7D, can be substantially controlled, and it can have a different concentration of dopant when compared to optional channel implant region 305. The width of the optional channel implant region 307 is controlled by the manner in which the nitride layer 273 (e.g., third insulating layer) is selectively etched. Selective etching of the nitride layer 273, as shown in FIG. 7C, can result in nitride spacers 275a, 275b, shown in FIG. 7D, which can form an optional channel implant region 307 that is substantially smaller than the width of the gate stack 205, and can also be self-aligning to the gate stack 205 depending upon the desired device's operating characteristics. The width of the channel implant region 307, as illustrated in FIG. 7D, can be narrower or wider than illustrated.

Furthermore, the dopant concentration of channel implant region 307 can be greater or less than the dopant concentration found in channel implant region 305.

As can be appreciated from the various embodiments, nitride spacers 275a, 275b can be fabricated to any desired size located above the conducting layer 202 or layer 211, to create different optional channel implant regions 305 and 307 that can be different in width and dopant concentration than depicted in FIG. 7B. In addition, the step of forming channel implant region 305, as illustrated in FIG. 7B, can be omitted if desired. As a result, only channel implant region 307 is formed utilizing nitride spacers 275a and 275b.

FIGS. 7A–7D illustrate only a small number of different possibilities that can be achieved when utilizing the methods of the present invention. Many different embodiments and variations are possible by creating additional spacers such as 275a and 275b. Additional spacers can also be used and created in conjunction or in lieu of spacers 275a, 275b to create even more different channel implant regions than is illustrated in FIGS. 7A–7D. For example, an additional insulating could be provided over spacers 275a, 275b and subsequently selectively etched to form additional spacers (not illustrated). The additional spacers could again define, at least in part, a third channel implant region within channel implant region 307, assuming that it was previously formed. For instance, a third channel implant region can be formed within channel implant region 307 if desired (not illustrated) that possesses a greater or lesser dopant concentration than channel implant implant region 307. Further, even more additional channel implant regions (e.g., a plurality of channel implant regions) are possible with the construction of additional spacers which at least in part, would define the width of the plurality of channel implant regions.

Figure 8A:
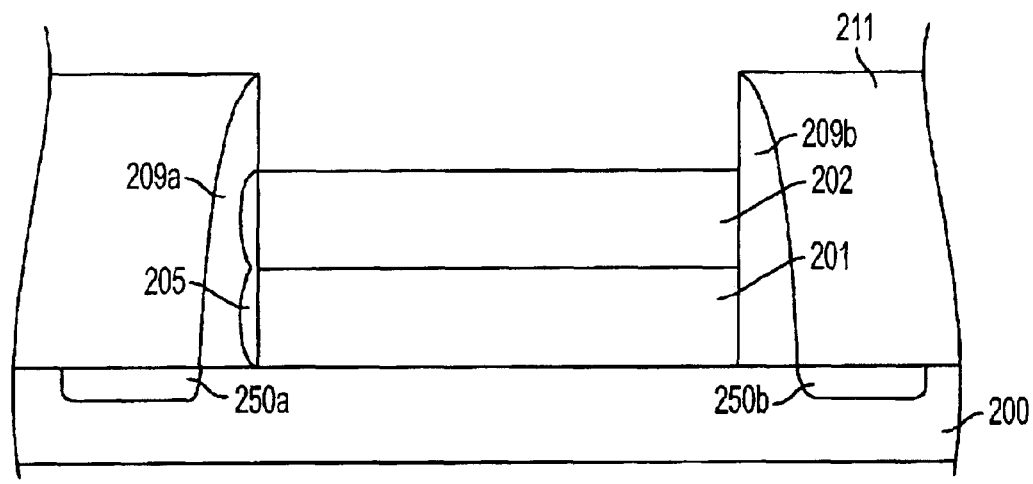
FIG. 8A is an illustration of the present invention in one embodiment prior to performing a first channel implant.
Figure 8B:
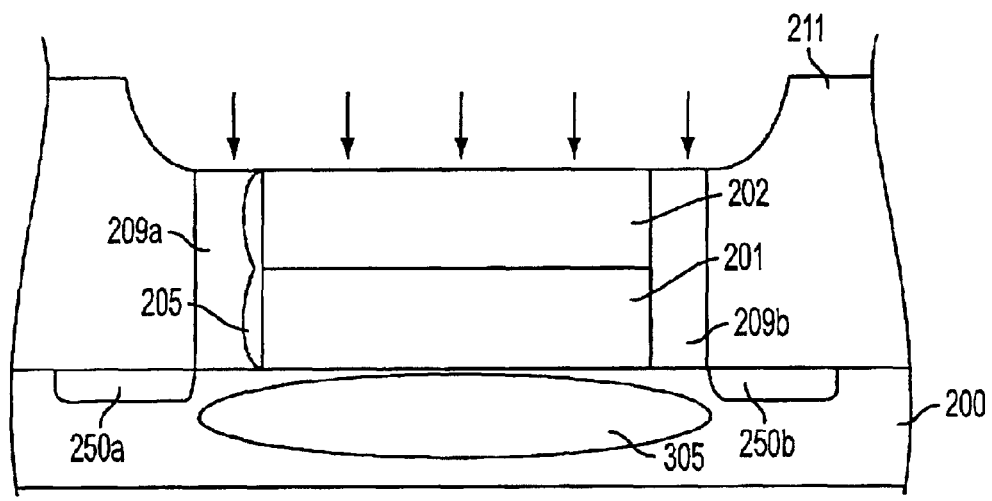
FIG. 8B is an illustration of the FIG. 8A structure after at least a portion of the insulating layer is removed and a first channel implant is performed.
Figure 8C:
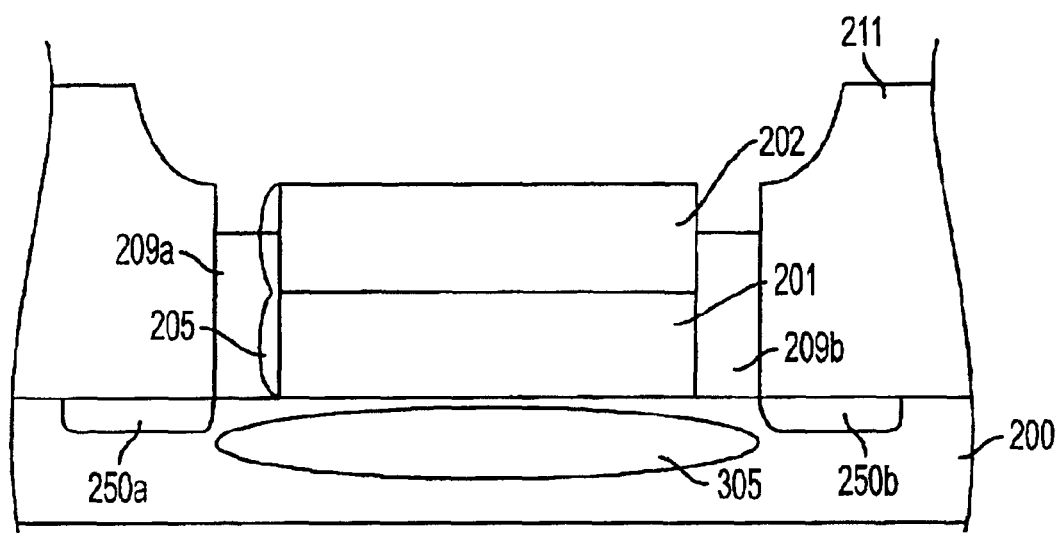
FIG. 8C is an illustration of the FIG. 8B structure after at least a portion of the spacers adjacent to the gate stack structure are partially etched.

Another variation of channel implants which can be produced is described below with reference to FIGS. 8A–8F. In this variant, after removal of the first insulating layer 203, portions of the second insulating layer 211 adjacent to the gate stack 205, are selectively etched to produce the structure in FIG. 8B, which possesses a wider implant area 305 than the width of the gate stack 205 (similar to the structure disclosed in FIG. 7B). In this exemplary embodiment, a clean is conducted after formation of channel implant region 305. If channel implant region 305 is not formed, a clean is conducted after selectively etching portions of the second insulating layer 211. An additional optional etch is next conducted on sidewall spacers 209a and 209b as shown in FIG. 8C, recessing them to a pre-determined depth (e.g., selectively etching them to a predetermined height). The depth of the etch should not extend to the gate oxide layer 201.

Figure 8D:
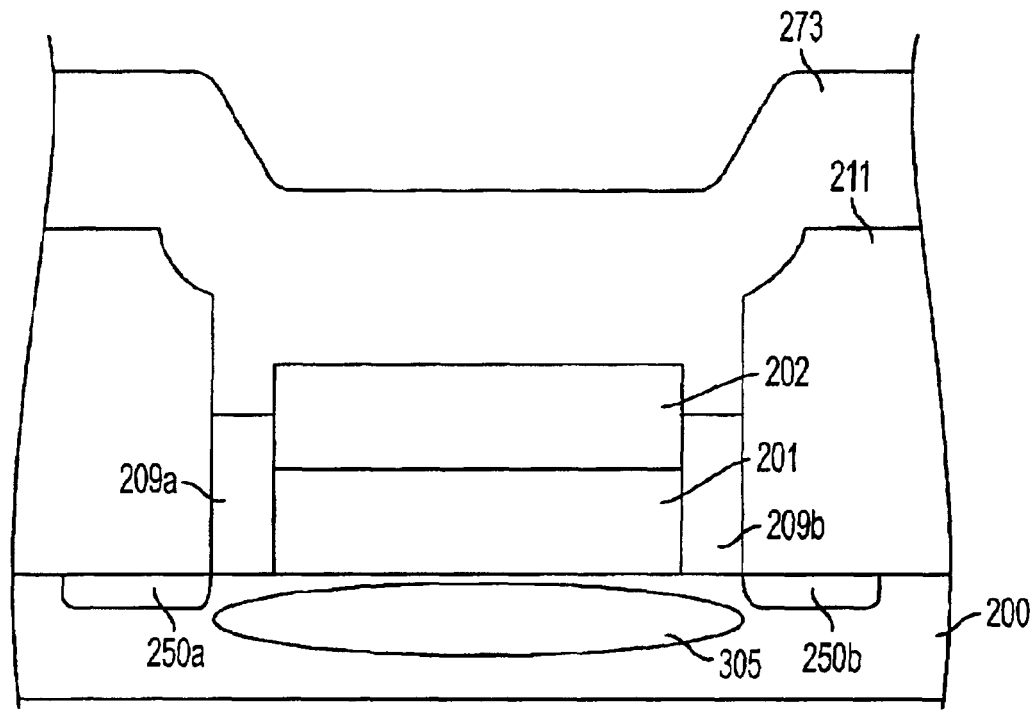
FIG. 8D is an illustration of the FIG. 8C structure after an additional insulating layer is deposited.
Figure 8E:
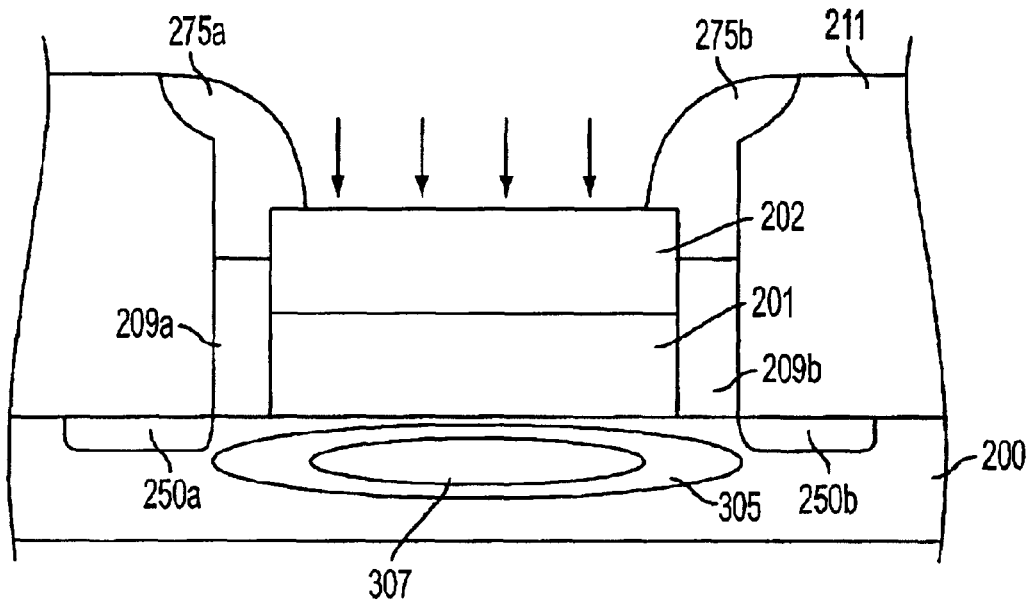
FIG. 8E is an illustration of the FIG. 8D structure after insulating spacers offset to the gate stack structure which cover at least a portion of the exposed conducting layer are formed and a second channel implant is formed within a first channel implant.

After the clean and etch, a nitride layer 273 (e.g., third insulating layer as described in reference to FIGS. 7A–7D) can be blanket deposited as shown in FIG. 8D, and selectively etched to produce nitride spacers 275a, 275b of FIG. 8E. A second channel implant region 307 can then be formed as shown in FIG. 8E that is self-aligning to the gate stack 205 at least in part defined by spacers 275a, 275b. As discussed previously with respect to FIGS. 7A–7D, the width of the channel implant region 307 can be narrower or wider than illustrated and possess a higher or smaller dopant concentration than channel implant region 305. Further, a third channel implant region can be formed within channel implant region 307 if desired. Still further, a plurality of channel implant regions can be formed within each previously formed channel implant region utilizing the methods of the present invention, at least in part defined by additionally formed spacers.

The purpose of conducting an optional etch on sidewall spacers 209a, 209b, is to allow a second set of spacers, such as 275a and 275b, to protect the edges of the conducting layer 202 from shorts, as illustrated in FIG. 8E. Spacers 275a and 275b can also provide further enhancement for future SAC (self-aligned contact) etching processes. This exemplary embodiment finds particular utility in fabricating DRAM devices. As described above, additional channel implant regions can also be formed within channel implant region 307 is desired (not illustrated). These additional channel implant regions can also possess a different dopant concentration and have different widths than optional channel implant regions 305 and 307.

Figure 9A:
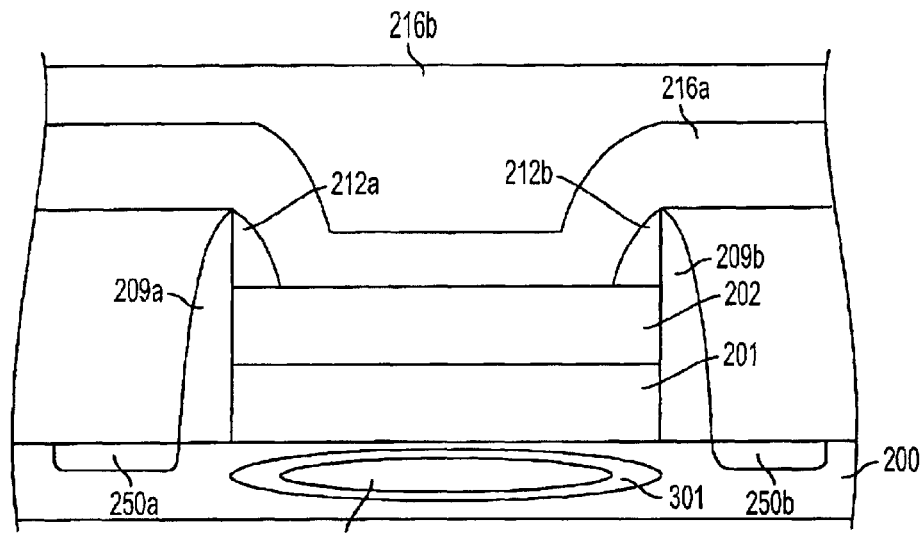
FIG. 9A is an illustration of the FIG. 7C structure after depositing a metal containing layer.
Figure 9B:
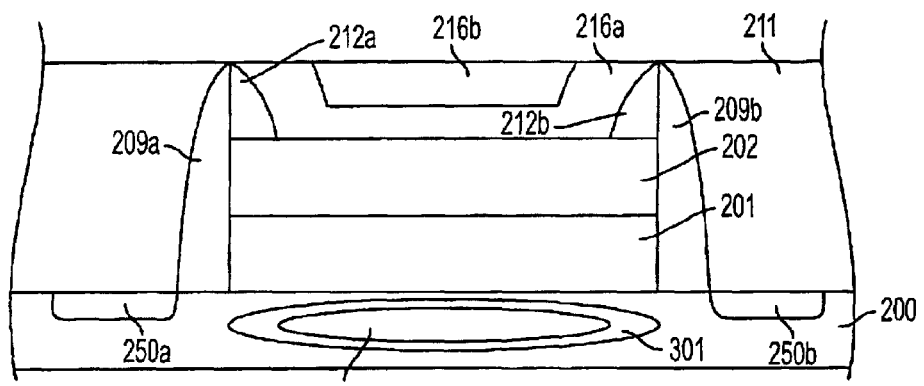
FIG. 9B is an illustration of the FIG. 9A structure after a CMP process.

After the optional channel implants are fabricated, spacers 212a, 212b as depicted in FIG. 6C, or 275a, 275b as depicted in FIG. 7D and FIG. 8E, are present over or adjacent to the gate stack 205. Referring now to FIGS. 9A–9B which illustrates spacers 212a, 212b following the methods of FIGS. 6A–6C implantation steps, a thin layer of tungsten nitride ($WN_x$) 216a is first blanket deposited followed next by a layer of tungsten(W) 216b. These metal layers 216a and 216b, e.g. refractory metal layers, are planarized using CMP as shown in FIG. 9B. Other techniques that are well-known in the art can also be utilized to create a substantially planar surface for the metal layers 216a and 216b.

In addition, other conductive layers that are well-known in the art can be used in lieu of the $W/WN_x$ layer combination. For example, a W/TiN combination can be deposited in place of the $W/WN_x$ layer combination. Still further, only one conductive layer can deposited if desired rather than a combination of metal layers. After the metal deposition steps, a silicide process is conducted to form a metallic silicide on the polysilicon 202 region of the gate stack 205. For purposes of a simplified description, the silicide process is not described. The formation of a metallic silicide is well-known in the art. The process described above of layering in $W/WN_x$ or W/TiN with reference to FIGS. 9A and 9B, can also be applied with equal success to the structures described in reference to FIGS. 7A–7D or FIGS. 8A–8E (or any other variants which are not illustrated), to form a silicide from the refractory metal in layers 216a, 216b and the polysilicon layer 202. The addition of the refractory metal layers after implantation allows fabrication of a structure that does not etch the metal layers. As described previously, the presence of metal layers during device fabrication can have deleterious effects. Since the metal layers are deposited after implantation and etching are completed, the deleterious effects are avoided. Accordingly, the methods of the present invention find particular utility anytime a structure is fabricated and one wishes to avoid etching the last formed layers during the fabrication process.

Figure 9C:
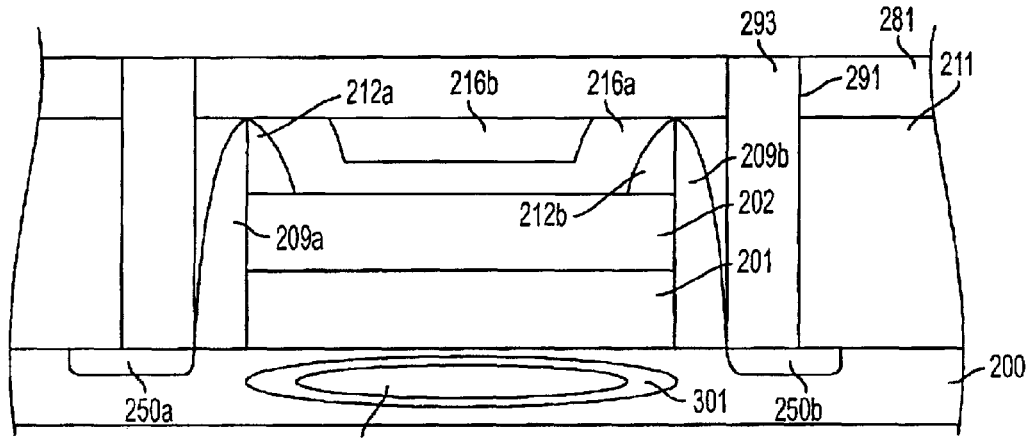
FIG. 9C is an illustration of the FIG. 9B structure after additional structures are formed.

Referring now to FIG. 9C, additional insulating layers and other structures can be fabricated over the thus formed transistor. For example, an insulating layer 281, e.g., BPSG, can be deposited over the FIG. 9B structure and openings 291 etched through layers 281 and 211 to the source/drain regions, which are filled with a conductor 293, e.g., polysilicon, to provide contacts to source/drain regions 250a, 250b. An opening in insulator 281, can also be etched to conductive layer 216b which is filled with a conductor to provide contact to the transistor gate.

Figure 10:
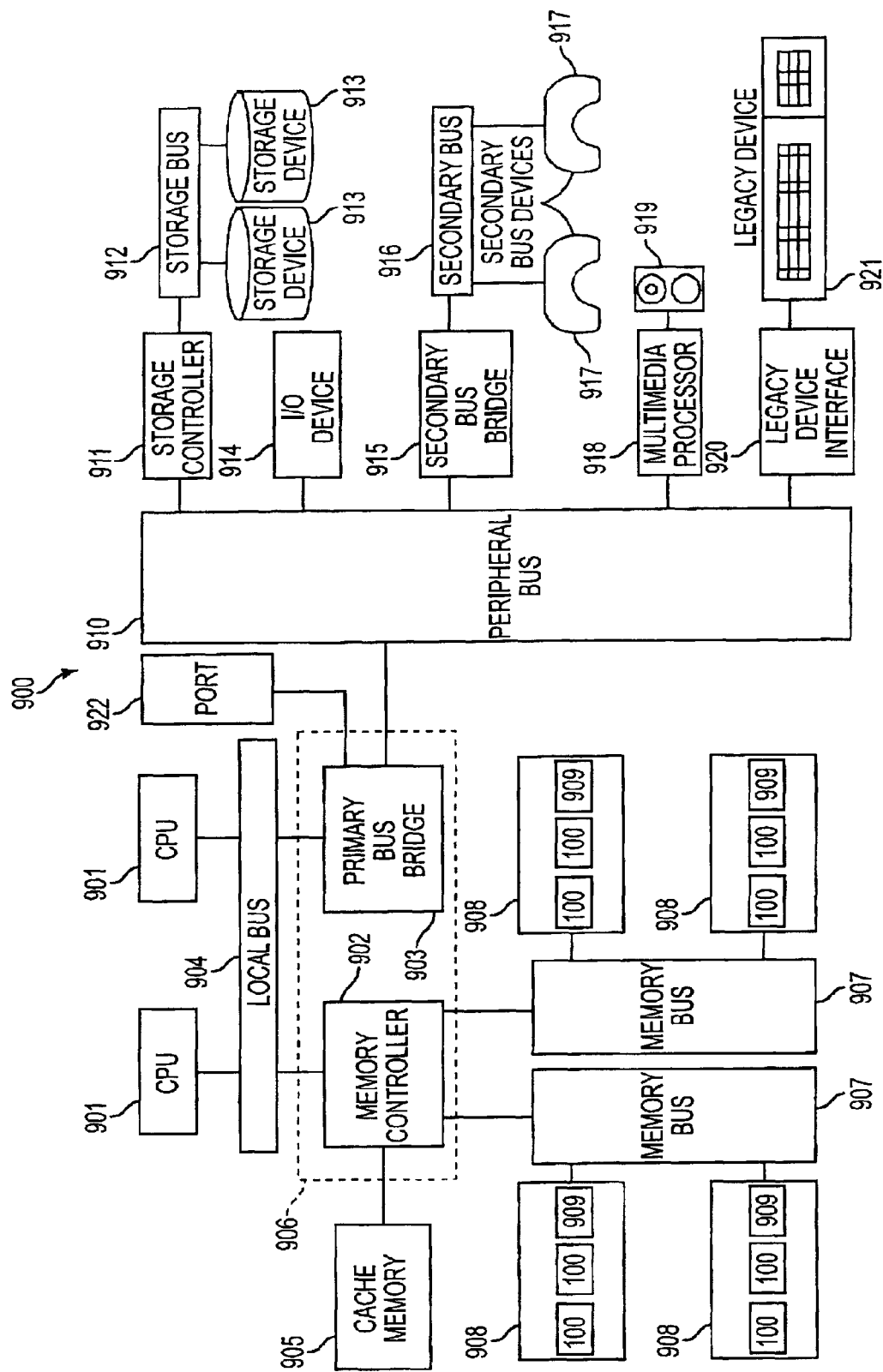
FIG. 10 is a block diagram of a system utilizing a gate stack structure in a transistor constructed in accordance with the present invention.

FIG. 10 is a block diagram of a processor system having many electronic components which may be fabricated as an integrated circuit chip having a transistor structure produced as described above. The processor system 900 includes one or more processors 901 coupled to a local bus 904. A memory controller 902 and a primary bus bridge 903 are also coupled the local bus 904. The processor system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device 100. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processor system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miscellaneous I/O device 914, a secondary bus bridge 915, a multimedia processor 918, and an legacy device interface 920. The primary bus bridge 903 may also coupled to one or more special purpose high speed ports 922. In a personal computer, for example, the special purpose port might be the Accelerated Graphics Port (AGP), used to couple a high performance video card to the processor system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processor system. For example, the secondary bus bridge may be an universal serial port (USB) controller used to couple USB devices 917 via to the processor system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processor system 900.

Any or all of the electronic and storage devices depicted in FIG. 10 may employ a transistor constructed in accordance with the invention. For example, the processors 901 and/or memory devices 100 may contain transistors fabricated in accordance with the invention. The processor system 900 illustrated in FIG. 10 is only an exemplary processing system with which the invention may be used. While FIG. 10 illustrates a processing architecture especially suitable for a general purpose computer, such as a personal computer or a workstation, it should be recognized that well-known modifications can be made to configure the processor system 900 to become more suitable for use in a variety of applications. For example, many electronic devices which require processing may be implemented using a simpler architecture which relies on a CPU 901 coupled to memory components 908 and/or memory devices 100.

These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders, as well as other electronic devices. The modifications may include, for example, elimination of unnecessary components, addition of specialized devices or circuits, and/or integration of a plurality of devices.

Although exemplary embodiments of the present invention have been described and illustrated herein, many modifications, even substitutions of materials, can be made without departing from the spirit or scope of the invention. Accordingly, the above description and accompanying drawings are only illustrative of exemplary embodiments that can achieve the features and advantages of the present invention. It is not intended that the invention be limited to the embodiments shown and described in detail herein. The invention is limited only by the scope of the following claims.

What is claimed as new and desired to be protected by Letters Patent of the United States is:

1. A method of fabricating a transistor, said method comprising:

forming a gate stack over a semiconductor substrate, said gate stack comprising a gate oxide layer, a conductive layer, and a first insulating layer;

forming first sidewall spacers on the sides of said gate stack;

forming source and drain regions on opposite sides of said gate stack;

forming a second insulating layer over said gate stack and substrate;

removing at least a portion of said second insulating layer and said first insulating layer of said gate stack to expose said conductive layer, wherein a portion of said second insulating layer outside of said first sidewall spacers remains after said at least a portion of said second insulating layer is removed, said method further comprising, removing another portion of said second insulating layer adjacent to said first sidewall spacers and an upper portion of said first sidewall spacers; and forming a channel implant region by implanting through said gate stack in said substrate which is at least in part defined by the removed portions of said second insulating layer; and forming at least one silicide layer over and in contact with said exposed conductive layer.

2. A method as in claim 1, wherein said conductive layer comprises a polysilicon layer and said method further comprises forming said silicide layer by providing at least one metal containing layer over said polysilicon layer and processing said metal containing layer and polysilicon layer to form said silicide layer, wherein said metal containing layer contains a material selected from the group consisting of tungsten(W), $WSi_x$, WN, Ti, TiN, and other combinations thereof.

3. A method as in claim 1, wherein said first insulating layer is silicon nitride.

4. A method as in claim 1, further comprising forming said source and drain regions by implantation to be self-aligned to said gate stack before forming said first sidewall spacers.

5. A method as in claim 4, wherein said implants are angled implants.

6. A method as in claim 5, wherein said implants are LDD implants.

7. A method as in claim 1, wherein said first sidewall spacers are formed by a spacer-forming insulating layer over said gate stack and substrate and etching said spacer-forming layer to produce said first sidewall spacers.

8. A method as in claim 7, wherein said spacer-forming layer is an oxide layer.

9. A method as in claim 1, wherein said source and drain regions are formed after said first sidewall spacers are formed.

10. A method as in claim 9, wherein lightly doped regions are formed in said substrate on opposite sides of said gate stack before said first sidewall spacers are formed.

11. A method as in claim 1, wherein said second insulating layer is a nitride layer.

12. A method as in claim 1, wherein said at least one channel implant region is at least in part defined by said first sidewall spacers.

13. A method as in claim 1, further comprising forming second sidewall spacers over and at the sides of said exposed conductive layer and forming a channel implant region by implanting through said gate stack wherein said channel implant region is at least in part defined by said second sidewall spacers.

14. A method as in claim 1, wherein said at least one channel implant region is formed to be narrower in width than the gate stack.

15. A method as in claim 1, wherein said at least one channel implant region is formed to be approximately equal in width to the gate stack.

16. A method as in claim 1, wherein said at least one channel implant region is formed to be wider in width than the gate stack.

17. A method as in claim 12, further comprising forming second sidewall spacers over and at the sides of said exposed conductive layer and forming another channel implant region by implanting through said gate stack wherein said another channel implant region is at least in part defined by said second sidewall spacers.

18. A method as in claim 12, wherein a portion of said second insulating layer outside of said first sidewall spacers remains after said at least a portion of said second insulating layer is removed, said method further comprising removing another portion of said second insulating layer adjacent to said first sidewall spacers and an upper portion of said first sidewall spacers; and forming another channel implant region by implanting through said gate stack in said substrate which is at least in part defined by the removed portions of said second insulating layer.

19. A method of fabricating a transistor, said method comprising:

forming a gate stack over a semiconductor substrate, said gate stack comprising a gate oxide layer, a conductive layer, and a first insulating layer;

forming first sidewall spacers on the sides of said gate stack;

forming source and drain regions on opposite sides of said gate stack;

forming a second insulating layer over said gate stack and substrate;

removing at least a portion of said second insulating layer and said first insulating layer of said gate stack to expose said conductive layer;

forming at least one additional set of second spacers over and at sides of said exposed conductive layer;

forming a plurality of channel implant regions in said substrate by implanting through said gate stack after said conductive layer is exposed, wherein said plurality of channel implant regions are at least in part defined by said first sidewall spacers and said at least one additional set of second spacers, wherein a portion of said second insulating layer outside of said first sidewall spacers remains after said at least a portion of said second insulating layer is removed, said method further comprising, removing another portion of said second insulating layer adjacent to said first sidewall spacers and an upper portion of said first sidewall spacers; and wherein at least one channel implant region is formed by implanting through said gate stack in said substrate which is at least in part defined by the removed portions of said second insulating layer; and, forming at least one silicide layer over and in contact with said exposed conductive layer.

20. A method as in claim 19, wherein said conductive layer comprises a polysilicon layer and said method further comprises forming said silicide layer by providing at least one unetched metal-containing layer over said polysilicon layer and processing said unetched metal-containing and polysilicon layer to form said silicide layer.

21. A method as in claim 19, wherein said first insulating layer is silicon nitride.

22. A method as in claim 19, further comprising forming said source and drain regions by implantation to be self-aligned to said gate stack before forming said first sidewall spacers.

23. A method as in claim 22, wherein said implants are angled implants.

24. A method as in claim 23, wherein said implants are LDD implants.

25. A method as in claim 19, further comprising forming a spacer-forming insulating layer over said gate stack and substrate and etching said spacer-forming layer to produce said first sidewall spacers.

26. A method as in claim 25, wherein said spacer-forming layer is an oxide layer.

27. A method as in claim 19, wherein said source and drain regions are formed after said first sidewall spacers are formed.

28. A method as in claim 19, wherein lightly doped regions are formed in said substrate on opposite sides of said gate stack before said first spacers are formed.

29. A method as in claim 19, wherein said second insulating layer is a nitride layer.

30. A method as in claim 19, wherein said step of forming a plurality of channel implant regions in said substrate through said gate stack after said conductive layer is exposed ccurs before said suicide layer is formed.

31. A method as in claim 19, wherein said at least one channel implant region is formed to be narrower in width than the gate stack.

32. A method as in claim 19, wherein said at least one channel implant region is formed to be approximately equal in width to the gate stack.

33. A method as in claim 19, wherein at least one channel implant region is formed to be wider in width than the gate stack.

34. A method as in claim 20, wherein said metal containing layer contains a material selected from the group consisting of W, $WSi_x$, WN, Ti, TiN, and other combinations thereof.

35. A method of fabricating a transistor, said method comprising:
- forming a gate stack over a semiconductor substrate, said gate stack comprising a gate oxide layer, a conductive layer, and a first insulating layer;
- forming first sidewall spacers on the sides of said gate stack;
- forming source and drain regions on opposite sides of said gate stack;
- forming a second insulating layer over said gate stack and substrate;
- removing at least a portion of said second insulating layer and said first insulating layer of said gate stack to expose said conductive layer;
- forming at least one channel implant region by implanting through said gate stack, wherein at least one channel implant region is formed to be wider in width than the gate stack; and
- forming at least one silicide layer over and in contact with said exposed conductive layer.

36. A method of fabricating a transistor, said method comprising:
- forming a gate stack over a semiconductor substrate, said gate stack comprising a gate oxide layer, a conductive layer, and a first insulating layer;
- forming first sidewall spacers on the sides of said gate stack;
- forming source and drain regions on opposite sides of said gate stack;
- forming a second insulating layer over said gate stack and substrate;
- removing at least a portion of said second insulating layer and said first insulating layer of said gate stack to expose said conductive layer;
- forming at least one channel implant region by implanting through said gate stack, said at least one channel implant region is at least in part defined by said first sidewall spacers, wherein a portion of said second insulating layer outside of said first sidewall spacers remains after said at least a portion of said second insulating layer is removed, said method further comprising removing another portion of said second insulating layer adjacent to said first sidewall spacers and an upper portion of said first sidewall spacers; and
- forming another channel implant region by implanting through said gate stack in said substrate which is at least in part defined by the removed portions of said second insulating layer; and
- forming at least one silicide layer over and in contact with said exposed conductive layer.

37. A method of fabricating a transistor, said method comprising:
- forming a gate stack over a semiconductor substrate, said gate stack comprising a gate oxide layer, a conductive layer, and a first insulating layer;
- forming first sidewall spacers on the sides of said gate stack;
- forming source and drain regions on opposite sides of said gate stack;
- forming a second insulating layer over said gate stack and substrate;
- removing at least a portion of said second insulating layer and said first insulating layer of said gate stack to expose said conductive layer;
- forming at least one additional set of second spacers over and at sides of said exposed conductive layer;
- forming a plurality of channel implant regions in said substrate by implanting through said gate stack after said conductive layer is exposed, wherein said plurality of channel implant regions are at least in part defined by said first sidewall spacers and said at least one additional set of second spacers, wherein at least one channel implant region is formed to be wider in width than the gate stack; and,
- forming at least one silicide layer over and in contact with said exposed conductive layer.

* * * * *

UNITED STATES PATENT AND TRADEMARK OFFICE
CERTIFICATE OF CORRECTION

PATENT NO. : 6,821,855 B2
DATED : November 23, 2004
INVENTOR(S) : Werner Juengling et al.

It is certified that error appears in the above-identified patent and that said Letters Patent is hereby corrected as shown below:

Column 4,
Line 1, reads "material is described herein" and should read -- material as described herein --

Column 8,
Line 10, reads "region 307 is desired" and should read -- region 307 as -- desired --

Column 9,
Line 33, reads "storage controller 911, an" and should read -- storage controller 911, a --
Line 36, reads "also coupled" and should read -- also be coupled --
Line 46, reads "may be an local" and should read -- may be a local --
Line 50, reads "may be an universal" and should read -- may be a universal --
Line 54, reads "one additional devices such as" and should read -- one of such additional devices as --

Column 12,
Line 54, reads "exposed ccurs" and should read -- exposed occurs --
Line 54, reads "before said suicide layer" and should read -- before said silicide layer --

Signed and Sealed this

Twenty-second Day of March, 2005

JON W. DUDAS
*Director of the United States Patent and Trademark Office*